United States Patent [19]

Foo et al.

[11] Patent Number: 5,291,891
[45] Date of Patent: Mar. 8, 1994

[54] MONITORING BODY FUNCTIONS USING FAST NMR PULSE SEQUENCES

[75] Inventors: Thomas K. Foo; Matthew A. Bernstein, both of Waukesha, Wis.

[73] Assignee: General Electric Company, Milwaukee, Wis.

[21] Appl. No.: 920,351

[22] Filed: Jul. 27, 1992

[51] Int. Cl.$^5$ ............................................. A61B 5/055
[52] U.S. Cl. ................................. 128/653.2; 324/309
[58] Field of Search ..................... 128/653.2; 324/307, 324/309

[56] References Cited

U.S. PATENT DOCUMENTS

| | | | |
|---|---|---|---|
| 4,767,991 | 8/1988 | Rzedzian | 128/653.2 |
| 4,986,272 | 1/1991 | Riederer et al. | 128/653.2 |
| 5,168,227 | 12/1992 | Foo et al. | 324/309 |
| 5,170,122 | 12/1992 | Bernstein | 324/309 |

OTHER PUBLICATIONS

*Time Course EPI of Human Brain Function During Task Activation*, Bandettini, et al., Magnetic Resonance In Medicine 25, 390–397 (1992).

*Dynamic MRI of Human Brain Oxygenation During Rest and Photic Stimulation*, Frahm, et al., Journal of Magnetic Resonance Imaging, Mar. 31, 1992.

*Primary Examiner*—Lee S. Cohen
*Assistant Examiner*—K. M. Pfaffle
*Attorney, Agent, or Firm*—Quarles & Brady

[57] ABSTRACT

$T^*_2$ contrast in images reconstructed from fast NMR pulse sequences is improved by increasing the gradient recalled echo time TE. The pulse repetition time TR is minimized to maintain high temporal resolution by asymmetrically acquiring the echo signal with its peak disposed bear the end of the acquisition window.

2 Claims, 4 Drawing Sheets

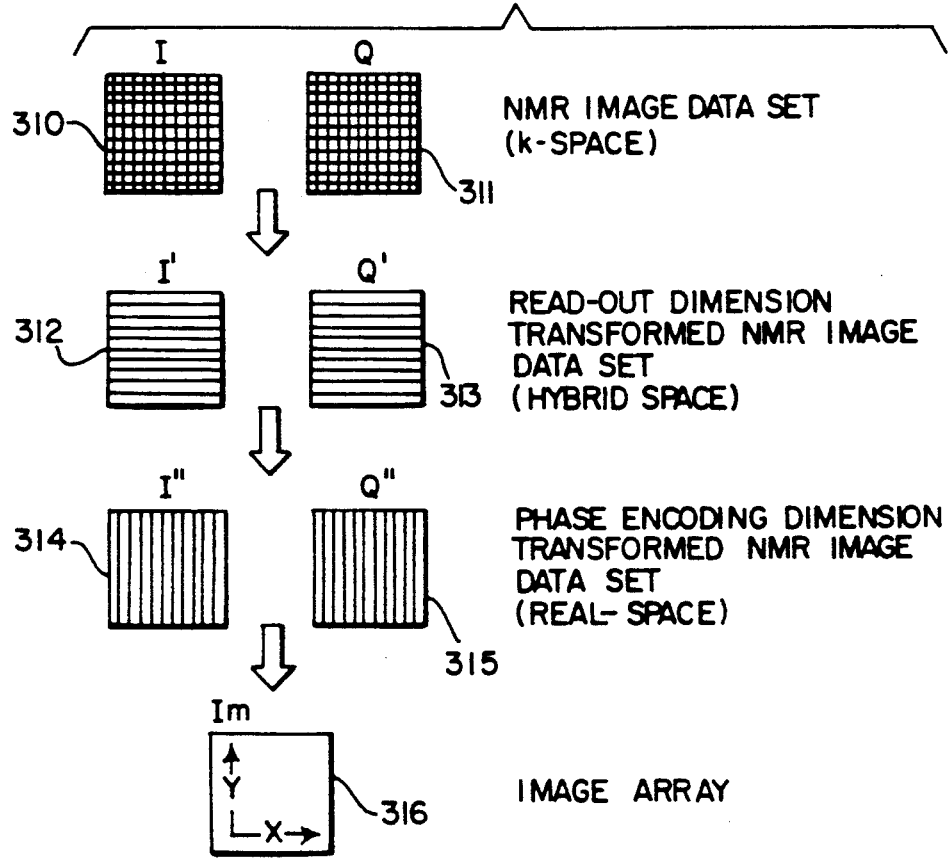
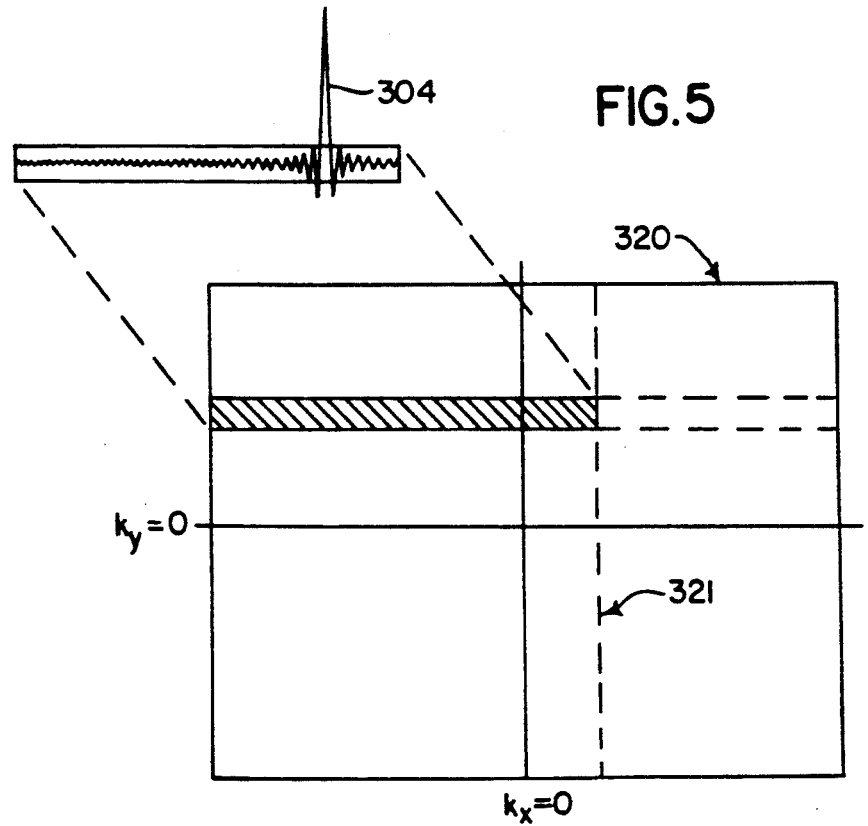

MONITORING BODY FUNCTIONS USING FAST NMR PULSE SEQUENCES

BACKGROUND OF THE INVENTION

The field of the invention is nuclear magnetic resonance imaging methods and systems. More particularly, the invention relates to fast NMR pulse sequences with enhanced susceptibility weighting in the reconstructed image.

Any nucleus that possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei that exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal that is emitted by the excited spins after the excitation signal $B_1$ is terminated. There is a wide variety of measurement sequences in which this nuclear magnetic resonance ("NMR") phenomena is exploited.

In simple systems the excited spins induce an oscillating sine wave signal in a receiving coil. The frequency of this NMR signal is the Larmor frequency, and its initial amplitude, $A_0$, is determined by the magnitude of the transverse magnetic moment $M_{xy}$. The amplitude, A, of the emission signal decays in an exponential fashion with time, t:

$$A = A_0 e^{-t/T^*_2}$$

The decay constant $1/T^*_2$ is inversely proportional to the exponential rate at which the aligned precession of the spins dephase after removal of the excitation signal $B_1$. This dephasing is caused by local magnetic field inhomogeneities produced in part by the differences in susceptibility between the spins. The dephasing caused by the spin system itself is referred to as the "spin-spin relaxation constant" $T_2$, and as will be described below, this characteristic is used in medical imaging to contrast tissues containing spins that exhibit different spin-spin relaxation times. NMR images that rely on this susceptibility phenomenon to contrast different tissues are referred to as "$T^*_2$ weighted images."

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts. In addition, if body functions such as brain activity are to be monitored with a series of images, it is imperative that each image be acquired in seconds, rather than minutes.

There is a class of fast pulse sequences that have a very short repetition time (TR) and result in complete scans which can be conducted in seconds rather than minutes. Whereas the more conventional pulse sequences have repetition times TR which are much greater than the spin-spin relaxation constant $T_2$ so that the transverse magnetization has time to relax between the phase coherent excitation pulses in successive sequences, the fast pulse sequences have a repetition time TR which is less than $T_2$ and which drives the transverse magnetization into a steady-state of equilibrium. Such techniques are referred to as steady-state free precession (SSFP) techniques and they are characterized by a cyclic pattern of transverse magnetization in which the resulting NMR signal refocuses at each RF excitation pulse to produce an echo signal. This echo signal includes a first part $S+$ that is produced after each RF excitation pulse and a second part $S-$ which forms just prior to the RF excitation pulse.

One well known SSFP pulse sequence is called gradient refocused acquired steady-state (GRASS). It utilizes a readout gradient $G_x$ to shift the peak in the $S+$ signal that is produced after each RF excitation pulse toward the center of the pulse sequence. In two-dimensional imaging, a slice selection gradient pulse is produced by the gradient $G_z$ and is immediately refocused in the well-known manner. A phase encoding gradient pulse $G_y$ is produced shortly thereafter to position encode the acquired NMR data. By using this SSFP pulse sequence, data for a complete image can be acquired in less than two seconds and a series of such images can be acquired over a period of time which enable such processes as brain functions to be dynamically monitored. Each acquired image captures the state of the monitored function over a relatively short time interval, and a "time resolution" of less than two seconds per image can be achieved.

As indicated above, a very useful image contrast mechanism in NMR medical imaging is $T^*_2$ contrast. As described by Peter A. Bandettini et al in "Time Course EPI of Human Brain Function During Task Activation," *Magnetic Resonance in Medicine*, 25, 390–397 (1992), the paramagnetic characteristics of blood change as a function of its oxygenation and this is reflected as a change in its $T^*_2$ constant. Thus, a series of NMR images may show the identical physical structures, but the brightness of the perfused tissue will differ as a function of the degree of oxygenation of the blood in the capillary bed. The amount of image contrast depends on the extent to which the $T^*_2$ changes. In turn, the amount of change in $T^*_2$ can be enhanced by using paramagnetic contrast agents such as Gadolinium DPTA, or by increasing the $T^*_2$ sensitivity of the pulse sequence by lengthening the echo time (TE).

While SSFP pulse sequences provide the desired time resolution for dynamic monitoring, they are not $T^*_2$ contrast sensitive because of their very short echo times (TE). Consequently, other pulse sequences, such as echo planar sequences (EPI), have been employed for dynamic studies because they provide good time resolution and good $T^*_2$ contrast. Unfortunately, EPI pulse sequences often require hardware enhancements to standard NMR systems and their use is, therefore, limited.

SUMMARY OF THE INVENTION

The present invention relates to a method for acquiring a series of NMR images with good time resolution and with good $T^*_2$ contrast. More specifically, each image in the series is generated by acquiring the S+ echoes produced from a set of SSFP pulse sequences, each S+ SSFP pulse sequence produces an echo signal with its peak occurring at time TE after the generation of an RF excitation pulse, by acquiring an asymmetrical echo signal such that the echo peak occurs in the latter half of an acquisition window and a portion of the echo signal following its peak is not acquired, and reconstructing images from the asymmetrical acquired echo signals.

A general object of the invention is to improve the $T^*_2$ contrast of an SSFP pulse sequence without incurring a substantial increase in the total scan time. By performing a partial echo signal acquisition, its peak can be delayed to increase the echo time TE and thereby improve the $T^*_2$ contrast of the pulse sequence. The acquisition window is shortened by terminating the acquisition shortly after the echo signal peak is acquired, and this also enables a reduction in the pulse sequence repetition time (TR). As a result, the echo time TE can be increased to improve $T^*_2$ contrast without a corresponding increase in the repetition time TR and total scan time.

The foregoing and other objectives and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 4 is a pictoral representation of the conventional processing of an acquired NMR data set;

FIG. 5 is a pictorial representation of the NMR data set acquired with the pulse sequence of FIG. 3.

DESCRIPTION OF THE PREFERRED EMBODIMENT

Figure 1:
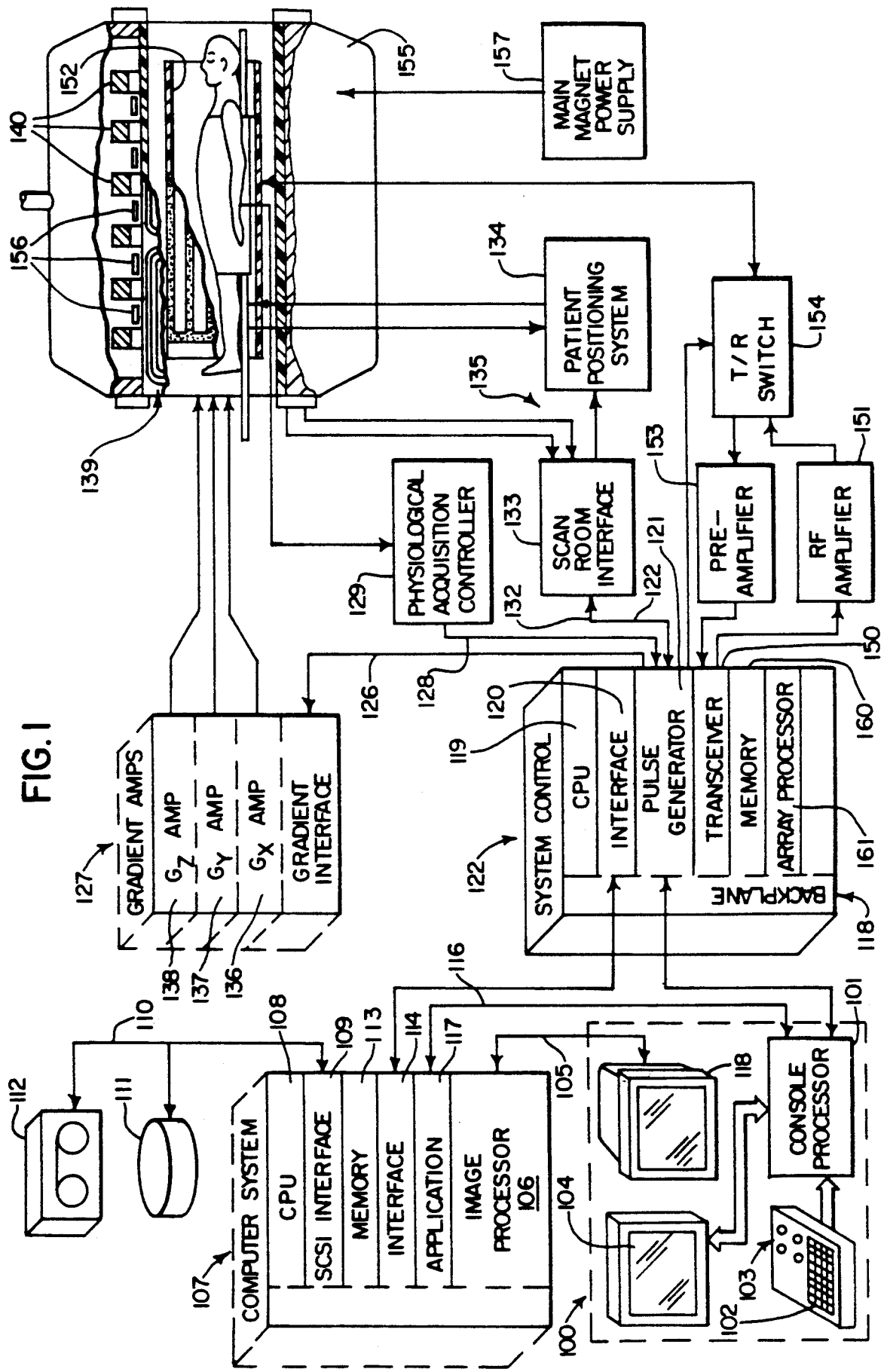
FIG. 1 is a block diagram of an NMR system which employs the present invention.

Referring first to FIG. 1 there is shown the major components of a preferred NMR system which incorporates the present invention and which is sold by the General Electric Company under the trademark "SIGNA". The operation of the system is controlled from an operator console 100 which includes a console processor 101 that scans a keyboard 102 and receives inputs from a human operator through a control panel 103 and a plasma display/touch screen 104. The console processor 101 communicates through a communications link 116 with an applications interface module 117 in a separate computer system 107. Through the keyboard 102 and controls 103, an operator controls the production and display of images by an image processor 106 in the computer system 107, which connects directly to a video display 118 on the console 100 through a video cable 105.

The computer system 107 is formed about a backplane bus which conforms with the VME standards, and it includes a number of modules which communicate with each other through this backplane. In addition to the application interface 117 and the image processor 106, these include a CPU module 108 that controls the VME backplane, and an SCSI interface module 109 that connects the computer system 107 through a bus 110 to a set of peripheral devices, including disk storage 111 and tape drive 112. The computer system 107 also includes a memory module 113, known in the art as a frame buffer for storing image data arrays, and a serial interface module 114 that links the computer system 107 through a high speed serial link 115 to a system interface module 120 located in a separate system control cabinet 122.

The system control 122 includes a series of modules which are connected together by a common backplane 118. The backplane 118 is comprised of a number of bus structures, including a bus structure which is controlled by a CPU module 119. The serial interface module 120 connects this backplane 118 to the high speed serial link 115, and pulse generator module 121 connects the backplane 118 to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 also connects through serial link 126 to a set of gradient amplifiers 127, and it conveys data thereto which indicates the timing and shape of the gradient pulses that are to be produced during the scan. The pulse generator module 121 also receives patient data through a serial link 128 from a physiological acquisition controller 129. The physiological acquisition control 129 can receive a signal from a number of different sensors connected to the patient. For example, it may receive ECG signals from electrodes or respiratory signals from a bellows and produce pulses for the pulse generator module 121 that synchronizes the scan with the patient's cardiac cycle or respiratory cycle. And finally, the pulse generator module 121 connects through a serial link 132 to scan room interface circuit 133 which receives signals at inputs 135 from various sensors associated with the position and condition of the patient and the magnet system. It is also through the scan room interface circuit 133 that a patient positioning system 134 receives commands which move the patient cradle and transport the patient to the desired position for the scan.

The gradient waveforms produced by the pulse generator module 121 are applied to a gradient amplifier system 127 comprised of $G_x$, $G_y$ and $G_z$ amplifiers 136, 137 and 138, respectively. Each amplifier 136, 137 and 138 is utilized to excite a corresponding gradient coil in an assembly generally designated 139. The gradient coil assembly 139 forms part of a magnet assembly 141 which includes a polarizing magnet 140 that produces either a 0.5 or a 1.5 Tesla polarizing field that extends horizontally through a bore 142. The gradient coils 139 encircle the bore 142, and when energized, they generate magnetic fields in the same direction as the main polarizing magnetic field, but with gradients $G_x$, $G_y$ and $G_z$ directed in the orthogonal x-, y- and z-axis directions of a Cartesian coordinate system. That is, if the magnetic field generated by the main magnet 140 is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x,y,z) in the bore of the magnet assembly 141 is given by $B(x,y,z) = B_0 + G_x \cdot x + G_y y G_z z$. The gradient magnetic fields are utilized to encode spatial information into the NMR signals emanating from the patient being scanned.

Located within the bore 142 is a circular cylindrical whole-body RF coil 152. This coil 152 produces a circularly polarized RF field in response to RF pulses provided by a transceiver module 150 in the system control cabinet 122. These pulses are amplified by an RF amplifier 151 and coupled to the RF coil 152 by a transmit/receive switch 154 which forms an integral part of the RF coil assembly. Waveforms and control signals are provided by the pulse generator module 121 and utilized by the transceiver module 150 for RF carrier modulation and mode control. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

In addition to supporting the polarizing magnet 140 and the gradient coils 139 and RF coil 152, the main magnet assembly 141 also supports a set of shim coil 156 associated with the main magnet 140 and used to correct inhomogeneities in the polarizing magnet field. The main power supply 157 is utilized to bring the polarizing field produced by the superconductive main magnet 140 to the proper operating strength and is then removed.

The NMR signals picked up by the RF coil 152 are digitized by the transceiver module 150 and transferred to a memory module 160 which is also part of the system control 122. When the scan is completed and an entire array of data has been acquired in the memory modules 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the video display 118.

Figure 2:
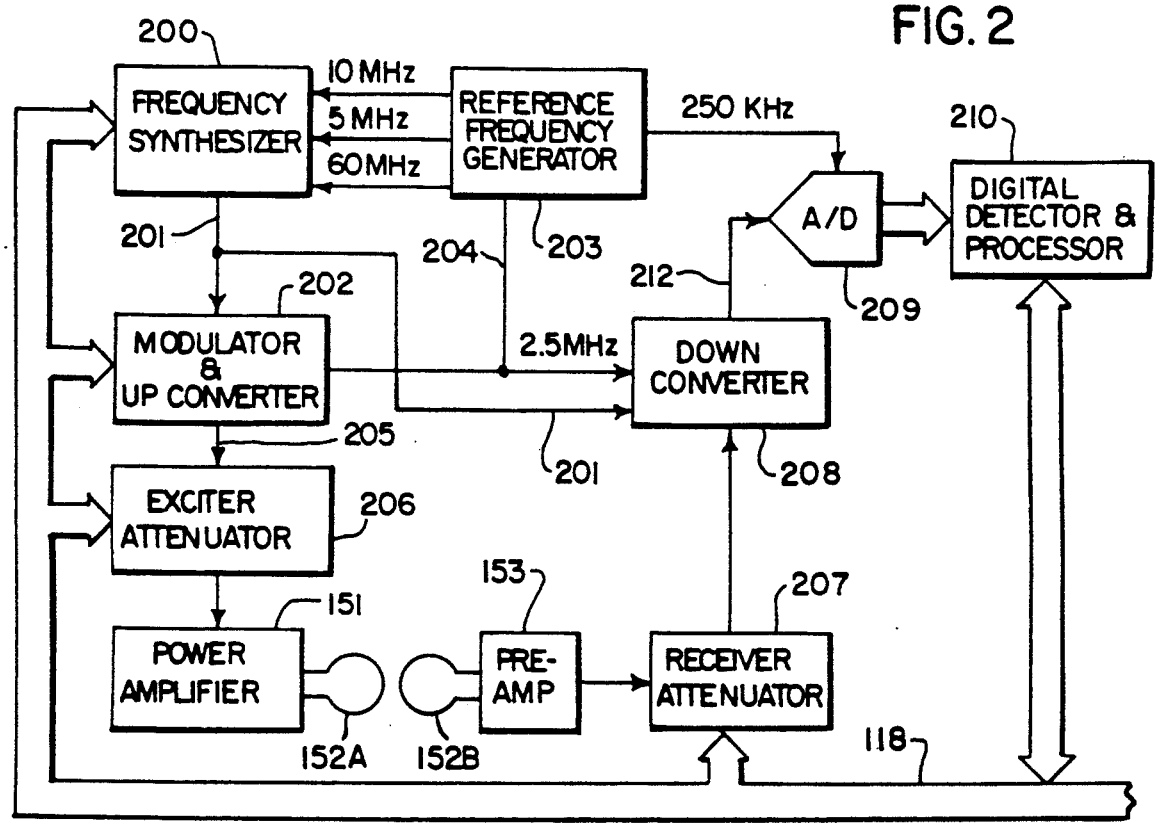
FIG. 2 is an electrical block diagram of the transceiver which forms part of the NMR system of FIG. 1.

Referring particularly to FIGS. 1 and 2, the transceiver 150 includes components which produce the RF excitation field $B_1$ through power amplifier 151 at a coil 152A and components which receive the resulting NMR signal induced in a coil 152B. As indicated above, the coils 152A and B may be separate as shown in FIG. 2, or they may be a single whole-body coil as shown in FIG. 1. The base, or carrier, frequency of the RF excitation field is produced under control of a frequency synthesizer 200 which receives a set of digital signals (CF) through the backplane 118 from the CPU module 119 and pulse generator module 121. These digital signals indicate the frequency and phase of the RF carrier signal which is produced at an output 201. The commanded RF carrier is applied to a modulator and up converter 202 where its amplitude is modulated in response to a signal R(t) also received through the backplane 118 from the pulse generator module 121. The signal R(t) defines the envelope, and therefore the bandwidth, of the RF excitation pulse to be produced. It is produced in the module 121 by sequentially reading out a series of stored digital values that represent the desired envelope. These stored digital values may, in turn, be changed from the operator console 100 to enable any desired RF pulse envelope to be produced. The modulator and up converter 202 produces an RF pulse at the desired Larmor frequency at an output 205.

The magnitude of the RF excitation pulse output through line 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference. Referring still to FIG. 1 and 2 the NMR signal produced by the subject is picked up by the receiver coil 152B and applied through the preamplifier 153 to the input of a receiver attenuator 207. The receiver attenuator 207 further amplifies the NMR signal and this is attenuated by an amount determined by a digital attenuation signal (RA) received from the backplane 118. The receive attenuator 207 is also turned on and off by a signal from the pulse generator module 121 such that it is not overloaded during RF excitation.

The received NMR signal is at or around the Larmor frequency, which in the preferred embodiment is around 63.86 MHz for 1.5 Tesla and 21.28 MHz for 0.5 Tesla. This high frequency signal is down converted in a two step process by a down converter 208 which first mixes the NMR signal with the carrier signal on line 201 and then mixes the resulting difference signal with the 2.5 MHz reference signal on line 204. The resulting down converted NMR signal on line 212 has a maximum bandwidth of 125 kHz and it is centered at a frequency of 187.5 kHz. The down converted NMR signal is applied to the input of an analog-to-digital (A/D) converter 209 which samples and digitizes the analog signal at a rate of 250 kHz. The output of the A/D converter 209 is applied to a digital detector and signal processor 210 which produce 16-bit in-phase (I) values and 16-bit quadrature (Q) values corresponding to the received digital signal. The resulting stream of digitized I and Q values of the received NMR signal is output through backplane 118 to the memory module 160 where they are employed to reconstruct an image.

To preserve the phase information contained in the received NMR signal, both the modulator and up converter 202 in the exciter section and the down converter 208 in the receiver section are operated with common signals. More particularly, the carrier signal at the output 201 of the frequency synthesizer 200 and the 2.5 MHz reference signal at the output 204 of the reference frequency generator 203 are employed in both frequency conversion processes. Phase consistency is thus maintained and phase changes in the detected NMR signal accurately indicate phase changes produced by the excited spins. The 2.5 MHz reference signal as well as 5, 10 and 60 MHz reference signals are produced by the reference frequency generator 203 from a common 20 MHz master clock signal. The latter three reference signals are employed by the frequency synthesizer 200 to produce the carrier signal on output 201. For a more detailed description of the receiver, reference is made to U.S. Pat. No. 4,992,736 which is incorporated herein by reference.

Figure 3:
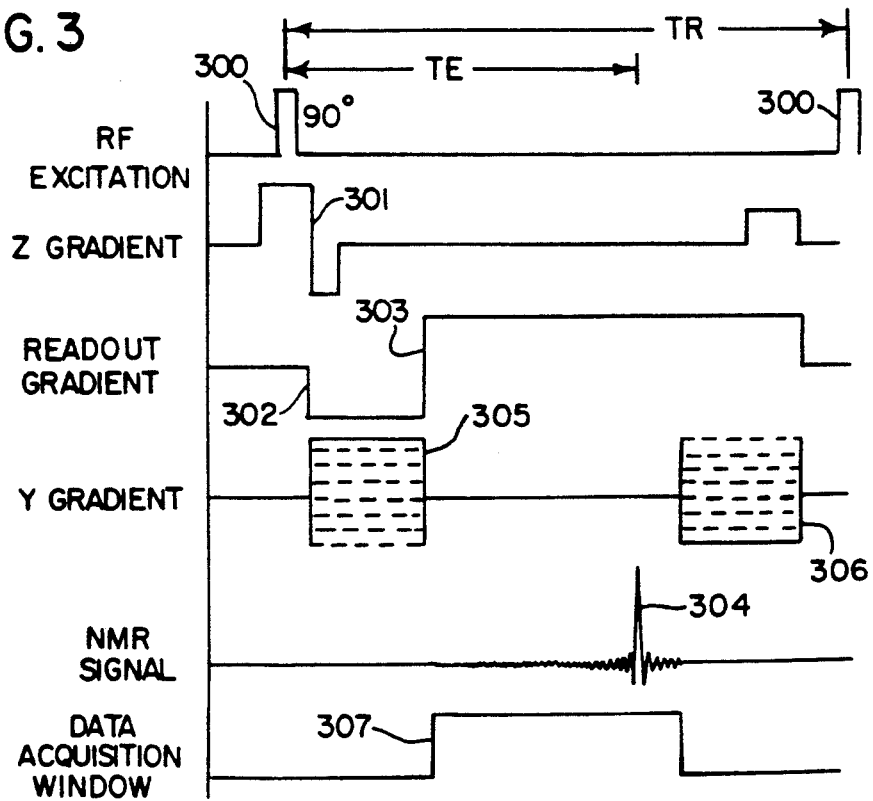
FIG. 3 is a graphic representation of a pulse sequence which is executed by the NMR system of FIG. 1 to practice the present invention.

The NMR system of FIG. 1 performs a series of pulse sequences to collect sufficient NMR data to reconstruct an image. The pulse sequence employed in the preferred embodiment is an SSFP sequence known as GRASS in which the S+ signal is acquired. This pulse sequence is shown in FIG. 3 and includes a selective RF excitation pulse 300 which is produced in the presence of a slice select gradient pulse 301. A negative readout gradient pulse 302 is then applied to dephase the excited spins and this is followed by a positive readout gradient pulse 303 which refocuses the spins and produces a gradient recalled NMR echo signal 304 which peaks at a time TE following the excitation pulse 300. The readout gradient pulse 303 also frequency encodes the signal 304 to provide x-axis position encoding. In addition, y-axis position encoding is provided by a phase encoding pulse 305 applied before the acquisition of echo signal 304, and a corresponding rewinder pulse 306 applied after the acquisition of echo signal 304. The phase encoding pulses 305 and 306 are stepped through a set of 128 values during the acquisition of a single image.

The distinguishing characteristic of the pulse sequence of FIG. 3 is the asymmetric acquisition of the echo signal 304. The data acquisition window 307 is aligned such that 128 samples of the echo signal 304 are acquired before its peak and only 32 samples are acquired after the peak. This is accomplished by increasing the area of lobe 302 on the readout gradient to greater than one-half the area of lobe 303. This asymmetric sampling enables the peak in the echo signal to be delayed to increase the echo time TE without significantly increasing the pulse sequence repetition time TR. For example, at an acquisition bandwidth of ±32 kHz the 160 samples can be acquired in 2.56 msecs rather than the 4.096 msecs window required to acquire 256 samples in a symmetric acquisition. This acquisition time reduction is reflected as a reduction in TR, which in turn, reduces the entire scan time and improves the time resolution of each acquired image. Note that the readout gradient 303 is extended for a period of time after the end of data acquisition such that the S− echo does not form within the data acquisition window.

When the present invention is used to acquire a series of images of the human brain after the injection of a Gadolinium DPTA contrast agent, for example, the pulse sequence of FIG. 3 is set to a TE of 12 msecs and the pulse repetition rate TR can be set to 16 msecs. If special gradient amplifiers and coils are used, the TR can be further reduced to 14 msecs. An entire 256×128 image can thus be acquired in less than 2 seconds, enabling brain functions to be accurately monitored for a period of time after injection of the contrast agent.

When a conventional scan is performed using a GRASS pulse sequence the NMR data is stored in the data disk 112 (FIG. 1) in the form of two arrays 310 and 311 as shown in FIG. 4. The array 310 contains the in-phase magnitude values I and the array 311 contains the quadrature values Q. Together these arrays 310 and 311 form an NMR image data set which defines the acquired image in what is referred to in the art as "k-space." Both arrays are completely filled with acquired data, for example 256 rows of data with 256 samples in each row.

To convert this k-space NMR data set into data which defines the image in real space (i.e. Cartesian coordinates), a two step Fourier transformation is performed on the I and Q arrays 310 and 311. The transformation is performed first in the readout direction which is the horizontal rows of the arrays 310 and 311 to produce two arrays 312 and 313. The array 312 contains the in-phase data and is labeled I' while the array 313 contains the quadrature data and is labeled Q'. The I' and Q' arrays 312 and 313 define the acquired image in what is referred to in the art as "hybrid-space."

The second Fourier transformation is performed in the phase encoding direction, which is the vertical columns of the arrays 312 and 313 to produce two arrays 314 and 315. The array 314 contains the transformed in-phase values and is labeled I", while the array 315 contains the quadrature values and is labeled Q". The arrays 314 and 315 are a data set which defines the acquired image in real space and the elements thereof are used to calculate the intensity values in a image array 316 in accordance with the following expression:

$$Im_{xy} = \sqrt{(I'_{xy})^2 + (Q'_{xy})^2}$$

The elements of the image array 316 are mapped to the main operator console 116 (FIG. 1) for display on a CRT screen.

As described above, to practice the present invention the NMR echo signal 304 is acquired asymmetrically. This is illustrated in FIG. 5, where 32 samples are acquired after the echo peak and 128 samples are acquired before the echo peak. Since the acquisition covers only part of k-space, a special reconstruction method must be used to avoid ringing and blurring artifacts. In the preferred embodiment the homodyne reconstruction technique disclosed in co-pending U.S. application Ser. No. 07/693,895 filed on May 1, 1991 and entitled "High Resolution Imaging Using Short TE And TR Pulse Sequences With Asymmetric NMR Echo Acquisition" is employed. The effective resolution of the reconstructed image depends on the number of samples acquired, and it has been found that an image equivalent in resolution to a 256 sample acquisition can be achieved with 160 samples when this method is used. In situations where resolution can be sacrificed, the number of samples can, of course, be reduced to shorten the data acquisition window and the repetition period TR.

Referring still to FIG. 5, each asymmetrically acquired NMR echo signal 304 is stored on a row of an NMR data set 320. As explained above, separate I and Q values are actually stored, but for clarity of explanation, only a single data array 320 is shown in FIG. 5. A complete scan is comprised of 256 views and thus the vertical, or phase encoding dimension of the NMR data set 320 extends from $k_y = -128$ to $k_y = 127$. The horizontal dimension of the NMR data set 320, however, is much larger than the 160 acquired samples. The sample NMR echo signals 304 fill only 60% of each row and the remaining 40% is filled with zeros. The NMR data set 320 extends from $k_x = -128$ to $k_x = 127$ in the horizontal, or readout gradient dimension. The sampled NMR spin-echo signals 304 extend from $k_x = +26$ to $k_x = -128$ to fill the NMR data set 320 only to the left of the dashed line 321. The elements to the right of the dashed line 321 are filled with zeros.

Figure 6:
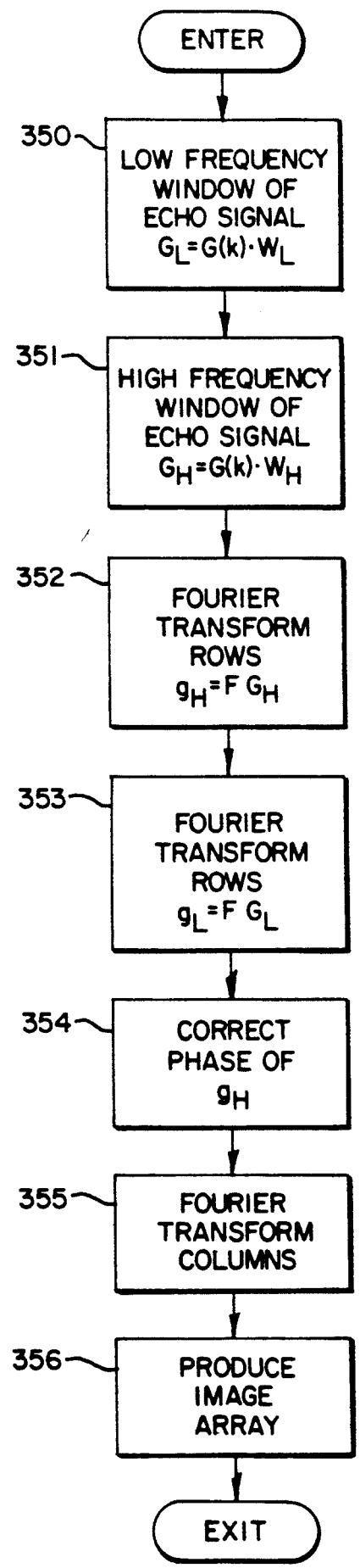
FIG. 6 is a flow chart of the processing of the NMR data set of FIG. 5 to reconstruct an image.

The NMR data set 320 is employed to produce an image using a homodyne reconstruction technique. This is accomplished under the direction of a program which is executed by the computer 101 (FIG. 1) and which is illustrated in FIG. 6. The first step in the reconstruction process is to produce two separate data sets ($G_L$) and ($G_H$) from the NMR data set 320 ($G_K$). This is accomplished by multiplying each row of the NMR data set 320 by the following low frequency window function $W_L$:

$$W_L = (1 + e^{(k-k_1)/T})^{-1} - (1 + e^{(k+k_1)T/})^{-1} \quad (1)$$

where:
T = 4 in the preferred embodiment;
$k_1 = 18$ in the preferred embodiment; and
k = the position of the value being windowed along the readout dimension ($k_x$), where $k = -128$ to 128.

The 256 values ($G_K$) in each row of the NMR data set 320 (including the zero-filled points) are multiplied by the value of the window function $W_L$ as indicated at process block 350 to produce a separate array $G_L$.

$$G_L = W_L \cdot G_K \quad (2)$$

Similarly, as indicated at process block 351, each value $G_K$ in the NMR data set 320 is also multiplied by a high frequency window $W_H$ as follows:

$$G_H = W_H \cdot G_K \quad (3)$$

where:
$$W_H = 2 - (1 + e^{(k-k_1)/T})^{-1} - (1 + e^{(k+k_1)T/})^{-1}, \quad (4)$$

T = 4
$k_1 = 18$
k = the position of the value being windowed along the readout dimension ($k_x$), where $k = -128$ to 128.

Each of the 256 by 256 element data arrays $G_L$ and $G_H$ are then separately Fourier transformed as indicated by process blocks 352 and 353. These are complex Fourier transformations along the horizontal, row direction as would normally be performed in a 2DFT reconstruction. Two, separate 256 by 256 element arrays $g_H$ and $g_L$ result. Due to the hermetian symmetry property of the Fourier transformation process, the zero filled portion of the NMR data set 320 is filled in by the transformation process and the transformed data in the array $g_H$ is complete and sufficient to produce an image. However, spatially dependent phase shifts present in the image must be corrected. The data in the transformed data array $g_L$ contains the low frequency phase information necessary to make this correction. This is based on the assumption that the spatially dependent phase shifts have primarily a low frequency variation and can be approximated by the phase of the data array $g_L$. The next step in the process, therefore, is to correct the phase of the array elements $g_H$ as indicated at process block 354. This can be performed in a number of ways, but it is in essence a process in which the phase ($\phi_H$) of each complex element in the transformed array $g_H$ is changed by the phase ($\phi_L$) of the corresponding element in the transformed array $g_L$. This is performed as follows in the preferred embodiment:

$$f_x = g_H \cdot |g_L| / g_L \quad (5)$$

where $f_x$ is the complex value of each element in a 256 by 256 element array (f) which represents the NMR image data in hybrid-space. An image is produced with the real part of these complex values $f_x$.

As indicated in FIG. 6 at process block 355, the next step is to Fourier transform the hybrid-space array f in the column, or phase encoding direction. This is a complex Fourier transformation as is done in a conventional 2DFT reconstruction, and it produces two 256 by 256 element data arrays which correspond to the arrays 314 and 315 in FIG. 4. The final step, therefore, is to create the image array 316 in the usual manner as indicated in FIG. 6 at process block 356.

Using a conventional GRASS pulse sequence with symmetric echo signal acquisition, a TE of 2.6 msecs and a TR of 9.4 msecs are obtained. By using the present invention with a delayed asymmetric echo signal acquisition, this TE can be increased to 7.8 msecs and the TR increased to 11.6 msecs. The TE can thus be tripled to enhance the $T^*_2$ sensitivity of the pulse sequence substantially, while the TR is only increased by 23%. In addition, much of this 23% increase represents increased time to play out additional gradient lobes and increase dead time for gradient cooling/duty cycle considerations which can be reduced further with improved gradient coils and gradient amplifiers.

We claim:
1. An NMR system, the combination comprising:
means for generating a polarizing magnetic field;
excitation means for generating an RF excitation magnetic field which produces transverse magnetization in spins subjected to the polarizing magnetic field;
receiver means for sensing an S+ NMR signal produced by the transverse magnetization;
data acquisition means connected to acquire the S+ NMR signal sensed by the receiver means and digitize the S+ NMR signal as a series of NMR signal samples during a data acquisition window;
first gradient means for generating a first magnetic field gradient to impart a first phase component into the S+ NMR signal which is indicative of spin location along a first coordinate axis;
second gradient means for generating a second magnetic field gradient to impart a second phase com- ponent into the S+ NMR signal which is indicative of spin location along a second coordinate axis;

third gradient means for generating a third magnetic field gradient after the data acquisition window such that an S− NMR signal does not form in the data acquisition window;

pulse control means coupled to the excitation means, first and second gradient means, and data acquisition means, said pulse control means for conducting a scan comprised of a series of pulse sequences in which the second magnetic field gradient is stepped through a series of discrete values, a corresponding series of S+ NMR echo signals are produced, the first magnetic field gradient is produced while each of said S+ NMR echo signals is produced, and each of said S+ NMR echo signals is acquired to form an NMR data set by generating a gradient lobe on the first magnetic field gradient that causes a peak of each of said S+ NMR echo signals to form asymmetrically near the end of the data acquisition window in which it is acquired; and processor means for storing each asymmetrically acquired S+ NMR echo signal in the NMR data set as part of a corresponding row in an NMR data array and for reconstructing an image from said NMR data set.

2. The NMR system as recited in claim 1 in which the processor means includes:

a) means for filling the remaining part of each row in the NMR data array with zeros;

b) means for performing a homodyne corrected Fourier transformation of each row of the NMR data array to produce a hybrid-space NMR data array;

c) means for performing a Fourier transformation on each column of the hybrid-space NMR data array to produce a real space NMR data array; and d) means for producing the image from the real space NMR data array.

* * * * *